United States Patent
Tang et al.

(10) Patent No.: US 9,529,254 B2
(45) Date of Patent: Dec. 27, 2016

(54) LAYOUT PATTERN DECOMPOSITION METHOD

(71) Applicant: UNITED MICROELECTRONICS CORP., Hsin-Chu (TW)

(72) Inventors: Chih-Hsien Tang, Taipei (TW); Yao-Jen Fan, Chiayi (TW); Chin-Lung Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 226 days.

(21) Appl. No.: 14/504,401

(22) Filed: Oct. 1, 2014

(65) Prior Publication Data
US 2016/0048072 A1    Feb. 18, 2016

(30) Foreign Application Priority Data
Aug. 18, 2014   (TW) .............................. 103128354 A

(51) Int. Cl.
| | | |
|---|---|---|
| G03B 27/32 | (2006.01) | |
| G03F 1/00 | (2012.01) | |
| G06F 17/50 | (2006.01) | |
| G03F 1/70 | (2012.01) | |
| G03F 7/20 | (2006.01) | |

(52) U.S. Cl.
CPC ............. *G03F 1/70* (2013.01); *G03F 7/70433* (2013.01); *G03F 7/70466* (2013.01); *G06F 17/5081* (2013.01)

(58) Field of Classification Search
CPC ........ G03F 1/144; G03F 1/70; G03F 7/70433; G03F 7/70466; G06F 17/5081
USPC .................................. 355/77; 430/5; 716/55
See application file for complete search history.

(56) References Cited

U.S. PATENT DOCUMENTS

| | | | |
|---|---|---|---|
| 7,617,476 B2 | 11/2009 | Hsu et al. | |
| 8,132,130 B2 | 3/2012 | Chen et al. | |
| 8,347,240 B2 | 1/2013 | Agarwal et al. | |
| 8,516,402 B1 * | 8/2013 | Wang ........................ | G03F 1/70 716/52 |

* cited by examiner

*Primary Examiner* — Colin Kreutzer
(74) *Attorney, Agent, or Firm* — Winston Hsu; Scott Margo

(57) ABSTRACT

A layout pattern decomposition method includes following steps. A layout pattern is received. The layout pattern includes a plurality of features, and an edge-to-edge space is respectively defined in between two adjacent features. A sum of a width of the edge-to-edge space and a width of the feature on a left side of the edge-to-edge space and a sum of the width of the edge-to-edge space and a width of the feature on a right side of the edge-to-edge space are respectively calculated. The sums and a predetermined value are respectively compared. When any one of the sums is smaller than the predetermined value, the two features on the two sides of the edge-to-edge space are colored by a first color and alternatively a second color. The features including the first color are assigned to a first pattern and the features including the second color to a second pattern.

15 Claims, 12 Drawing Sheets

LAYOUT PATTERN DECOMPOSITION METHOD

BACKGROUND OF THE INVENTION

1. Field of the Invention

The present invention relates to a layout pattern decomposition method, and more particularly, to a layout pattern decomposition method for double patterning technique.

2. Description of the Prior Art

With rapid advancement of semiconductor fabricating technology, the integration level of integrated circuits (ICs) is bound to increase continuously in order to improve the device speed and performance and comply with current requirements for lightweight, slimness, and compactness. Improvement of the integration level is inevitably relies on reducing size of feature patterns and pitches between features patterns which construct the devices and ICs. However, size and/or pitch reduction increases difficulty and complexity of device productions and suffers limitations in the prior art.

For example, lithography beyond the 45 nm node faces numerous challenges. The challenges are associated with the use of photoresists to define sub-40 nm features, including line-edge roughness, shot noise, acid diffusion blur, and resist collapse. As a countermeasure against to those problems, there have been proposed multi patterning technique and double patterning technique. In the double patterning technique, the features of a given target pattern are decomposed/separated into two different colors and masks, and then imaged separately to form the desired pattern which includes the original given target pattern in an objective layer.

Accordingly, it is an imperative issue to efficaciously decompose and separate one given target feature pattern into two masks and to successfully form the original given feature pattern by double patterning technique.

SUMMARY OF THE INVENTION

According to an aspect of the present invention, a layout pattern decomposition method is provided. The layout pattern decomposition method includes steps of: (a) receiving a layout pattern comprising a plurality of features, and an edge-to-edge space being respectively defined between two adjacent features; (b) respectively calculating a sum of a width of the edge-to-edge space and a width of the feature on a left side of the edge-to-edge space, and a sum of the width of the edge-to-edge space and a width of the feature on a right side of the edge-to-edge space; (c) comparing the sums with a predetermined value, when any one of the sums is smaller than the predetermined value, the two features on the two sides of the edge-to-edge space are colored by a first color and alternatively a second color; and (d) assigning the features including the first color to a first pattern and assigning the features including the second color to a second pattern. Steps (a)-(d) are implemented using a computer.

According to another aspect of the present invention, a layout pattern decomposition method is provided. The layout pattern decomposition method includes steps of: (a) receiving a layout pattern comprising a plurality of features; (b) recognizing and categorizing the features into a plurality of one-dimension (1D) features and a plurality of two-dimension (2D) features, the 1D features respectively comprising only one first block extending along a first direction and the 2D features respectively comprising one first block extending along the first direction and at least a second block extending along a second direction; (c) comparing a sum of a width of a first space between two adjacent 1D features and a width of the 1D features next to the first space with a first predetermined, when the sum is smaller than the first predetermined value, the two 1D features on the two sides of the first space are colored by a first color and alternatively a second color; (d) comparing a width of a second space between two adjacent 2D features with a second predetermined value, when the width of the second space is smaller than the second predetermined value, the two 2D features on the two sides of the second space are colored by the first color and alternatively the second color; and (e) assigning the 1D features and the 2D features including the first color to a first pattern, and assigning the 1D features and the 2D features including the second color to a second pattern. Steps (a)-(e) are implemented using a computer.

According to still another aspect of the present invention, a layout pattern decomposition method is provided. The layout pattern decomposition method includes steps of: (a) receiving a layout pattern comprising a plurality of features; (b) recognizing and categorizing the features into a plurality of 1D features and a plurality of 2D features, the 1D features respectively comprising only one first block extending along a first direction and the 2D features respectively comprising one first block extending along the first direction and at least a second block extending along a second direction, and at least one of the 1D features being adjacent to one of the 2D features; (c) comparing a width of a space between the adjacent 1D feature and 2D feature with a second predetermined value, when the width of the space is smaller than the second predetermined value, the 1D feature and the 2D feature are colored by a first color and alternatively a second color; and (d) assigning the 1D features and the 2D features including the first color to a first pattern, and assigning the 1D features and the 2D features including the second color to a second pattern. Steps (a)-(d) are implemented using a computer.

According to the layout pattern decomposition methods provided by the present invention, different comparison rules are adopted depending on different types of features: By comparing the sum of the width of the edge-to-edge space between two adjacent features and at least one of the feature next to the edge-to-edge space with the first predetermined value, or by comparing the width of the space between two adjacent features with the second predetermined value, the features are colored by the first color and alternatively the second color systematically and efficaciously. The features including different colors are then respectively assigned to the first pattern or the second pattern. More important, when the first pattern and the second pattern are respectively outputted to different masks, features formed on any single mask can be successfully and precisely formed in the double patterning lithography. Accordingly, the layout pattern decomposition methods provided by the present invention improve the result of the double patterning lithography.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
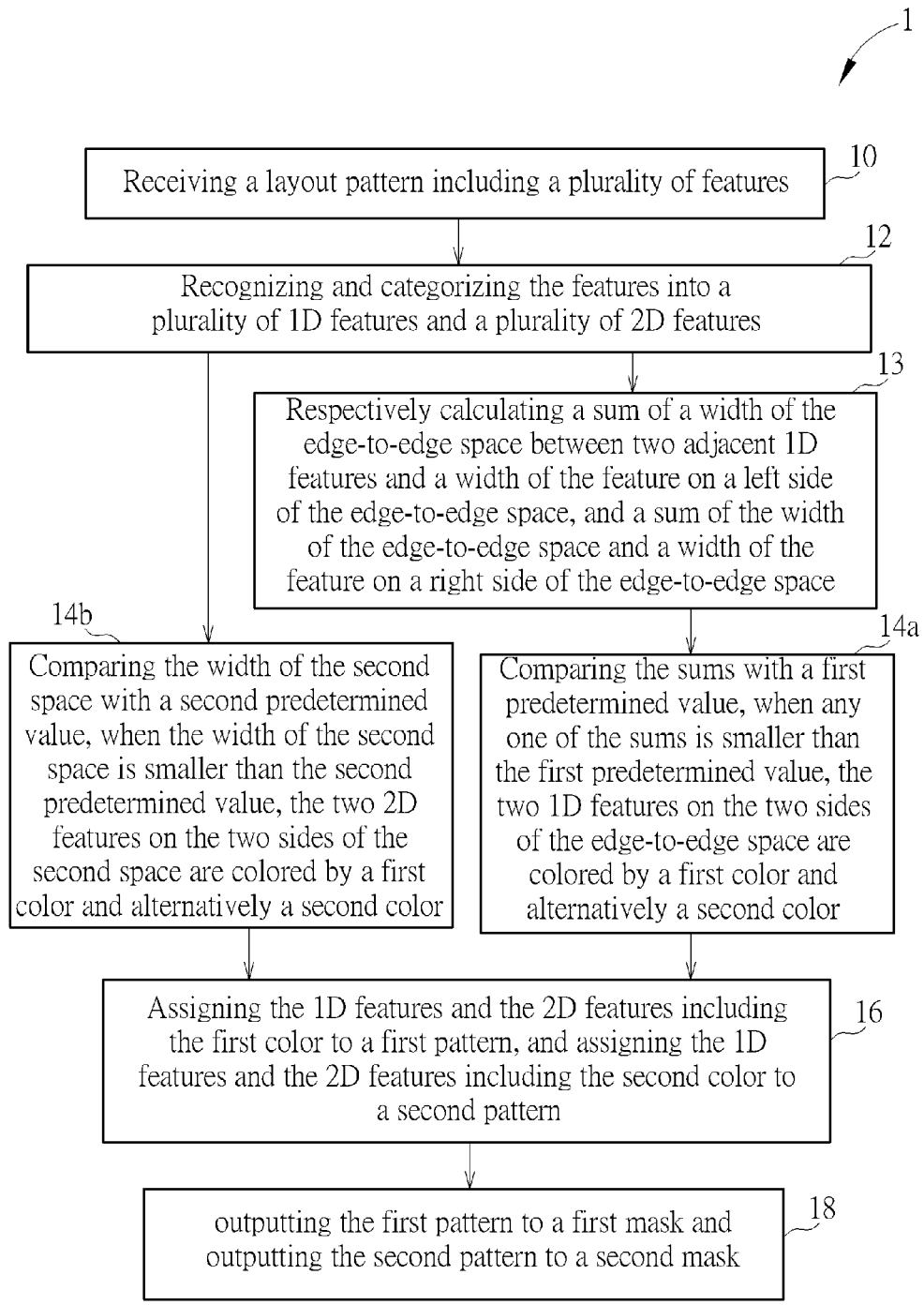
FIG. 1 is a flow chart of a layout pattern decomposition method provided by a first preferred embodiment of the present invention.

Please refer to FIGS. 1-5B, FIG. 1 is a flow chart of a layout pattern decomposition method provided by a first preferred embodiment of the present invention, and FIGS. 2-5B are schematic drawings illustrating the layout pattern decomposition method provided by the first preferred embodiment. As shown in FIG. 1, a layout pattern decomposition method 1 is provided by the present invention, and the layout pattern decomposition method 1 includes:

STEP 10: Receiving a layout pattern including a plurality of features

Figure 2:
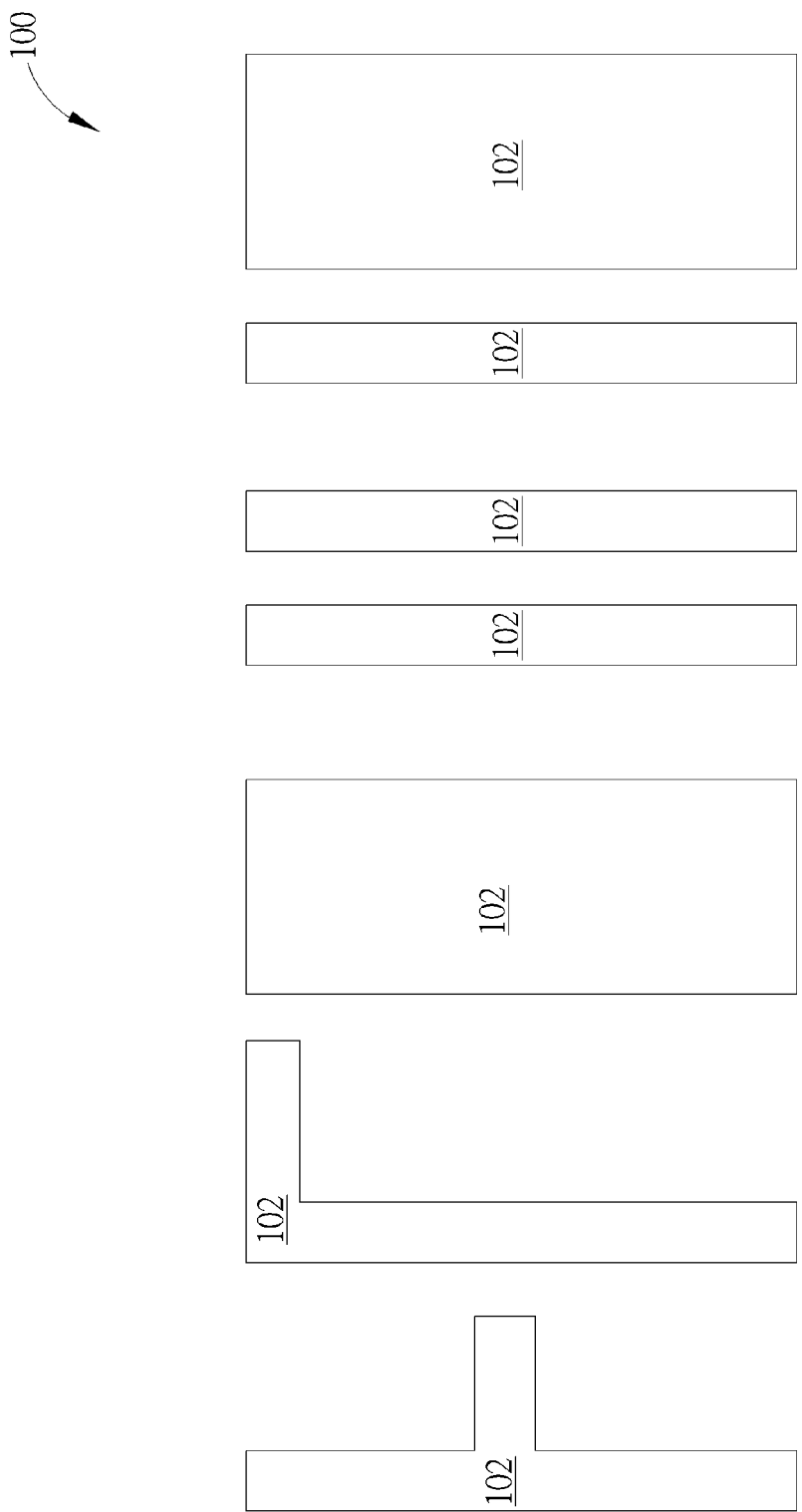
FIGS. 2-5B are schematic drawings illustrating the layout pattern decomposition method provided by the first preferred embodiment of the present invention.

Please refer to FIG. 2 together with FIG. 1. As shown in FIG. 2, a layout pattern 100 is received. The layout pattern 100 includes a plurality of features 102. It is noteworthy that the layout pattern 100 includes a circuit layout pattern that can be formed in any objective layer for constructing the ICs. For example, the layout pattern 100 can be a back-end-of-line (BEOL) layout pattern such as an interconnection layout pattern, or the layout pattern 100 can be a front-end-of-line (FEOL) layout pattern such as device pattern. Furthermore, specific examples of arrangements and sizes of the features 102 in the layout pattern 100 as shown in FIGS. 2-5B are provided to simplify the present invention. These are merely examples and are not intended to be limiting.

Figure 3:
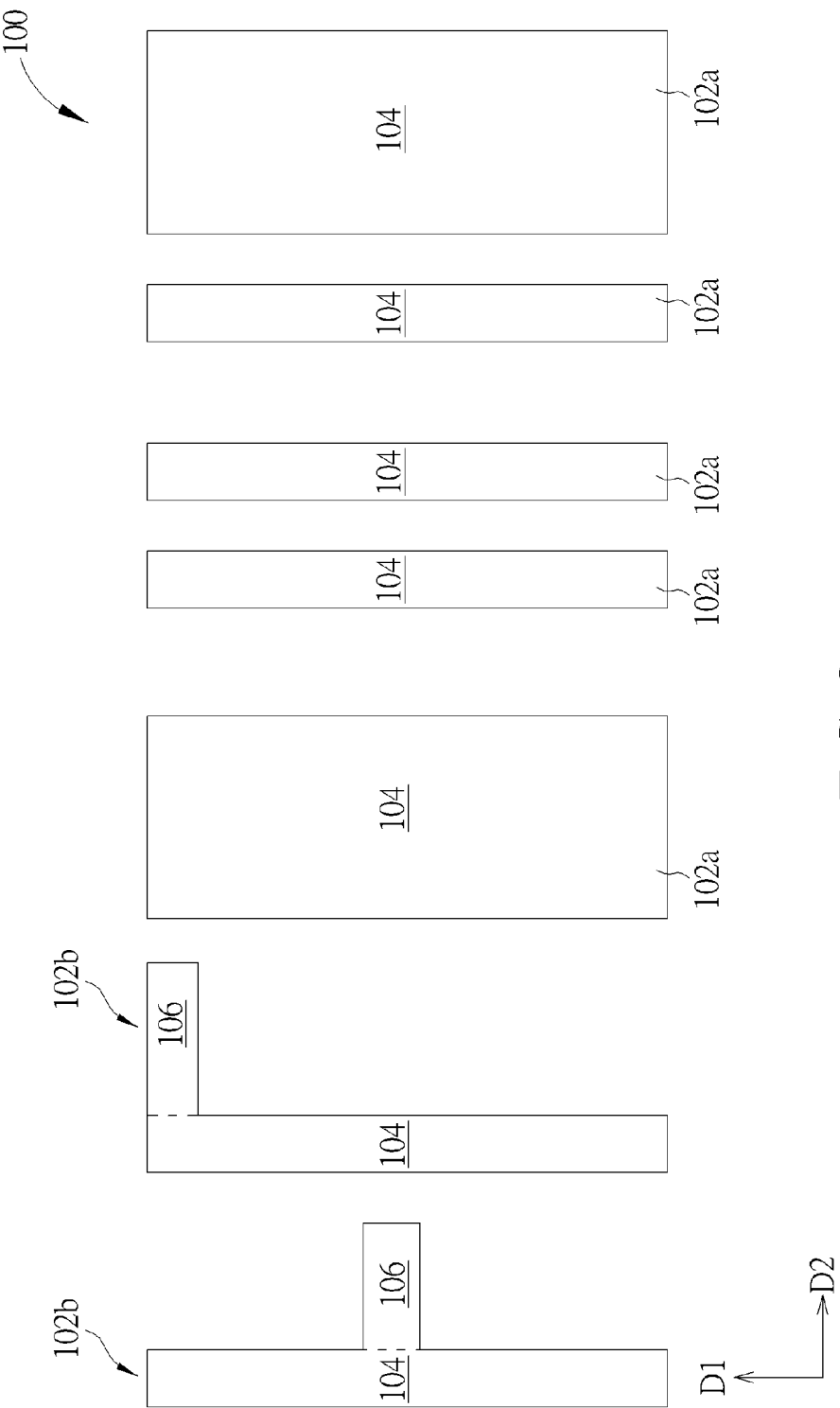

The layout pattern decomposition method 1 provided by the present invention further includes:

STEP 12: Recognizing and categorizing the features into a plurality of 1D features and a plurality of 2D features Please refer to FIG. 3 together with FIG. 1. Next, the features 102 are recognized and categorized. In detail, when the features 102 including only one first block 104 extending along a first direction D1 are recognized, those features 102 are categorized to the one-dimension (hereinafter abbreviated as 1D) features 102a. And when the features 102 including one first block 104 extending along the first direction D1 and at least a second block 106 extending along a second direction D2 are recognized, those features 102 are categorized to the two-dimension (hereinafter abbreviated as 2D) features 102b. The first block 104 and the second block 106 of each 2D feature 102b physically contact each other, as shown in FIG. 3. Additionally, the first direction D1 and the second direction D2 are perpendicular to each other in accordance with the preferred embodiment.

Figure 4A:
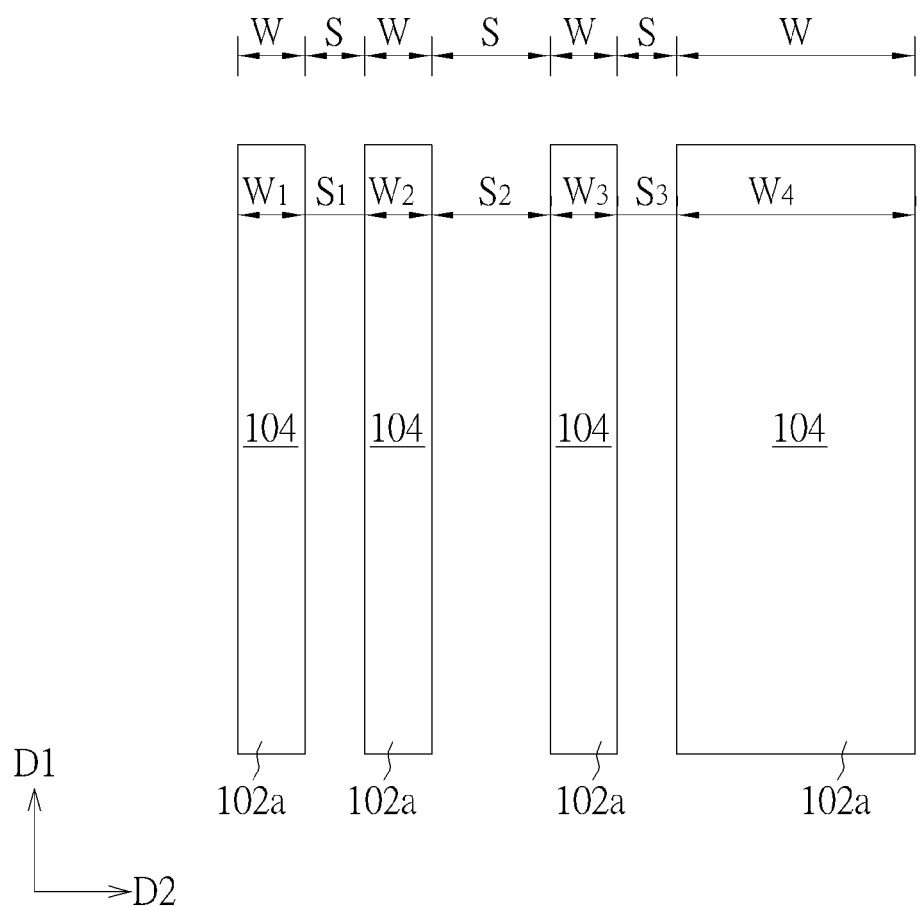
Figure 4B:
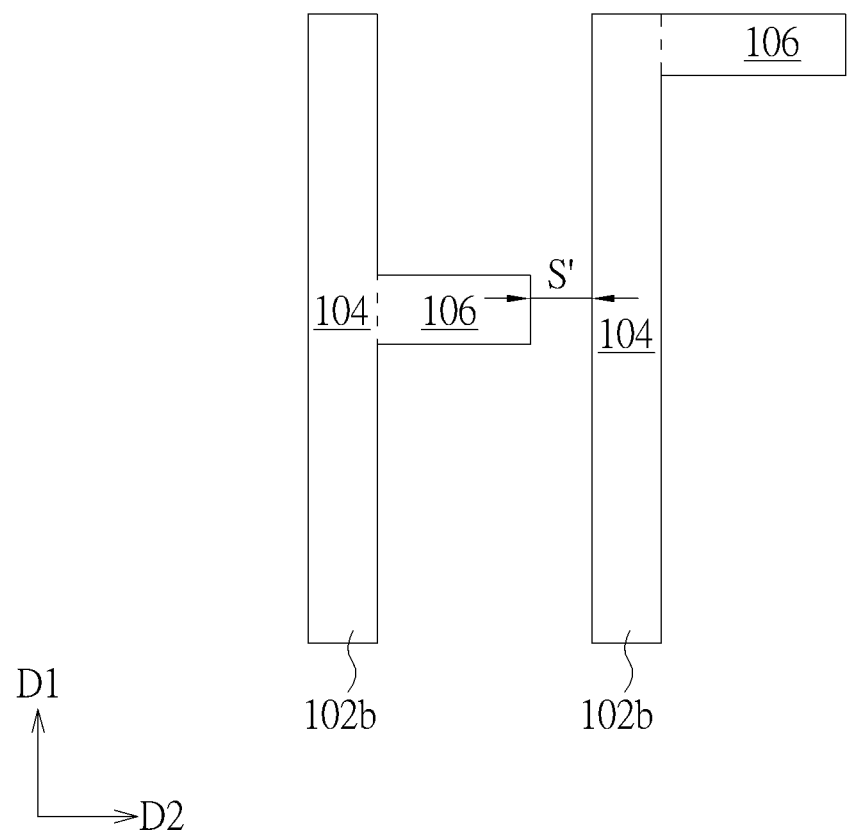

The layout pattern decomposition method 1 provided by the present invention further includes:

STEP 13: Respectively calculating a sum of a width of the edge-to-edge space between two adjacent 1D features and a width of the feature on a left side of the edge-to-edge space, and a sum of the width of the edge-to-edge space and a width of the feature on a right side of the edge-to-edge space Please refer to FIGS. 4A and 4B. After categorizing the features 102, measurement and calculation are performed to different types of the features 102a and 102b: As shown in FIG. 4A, there are 1D features 102a adjacent to each other, and those adjacent 1D features 102a include a first space S formed therebetween. More important, the first space S is defined by the edges of the adjacent two 1D features 102a and therefore the first space S is taken as an edge-to-edge space S. Each of the 1D features 102a includes a width W. According to the preferred embodiment, a sum of a width of the edge-to-edge space S and a width of the 1D feature 102a on the left side of the edge-to-edge space S is respectively calculated, and a sum of the width of the edge-to-edge space S and a width of the 1D feature 102a on the right side of the edge-to-edge space S is respectively calculated. Please refer to FIG. 4B together with FIG. 4A. To the 2D features 102b, a width of a narrowest space between two adjacent 2D features 102b is defined as a second space S' and the second space S' is measured. Those skilled in the art would easily realize that since the 2D features 102b includes the first block 104 extending along the first direction D1 and the second block 106 extending along the second direction D2, there may be many spaces between the two adjacent 2D features 102b. However, only the narrowest space S' between the two adjacent 2D features 102b is picked as the second space S' and then be measured, as shown in FIG. 4B.

Figure 5A:
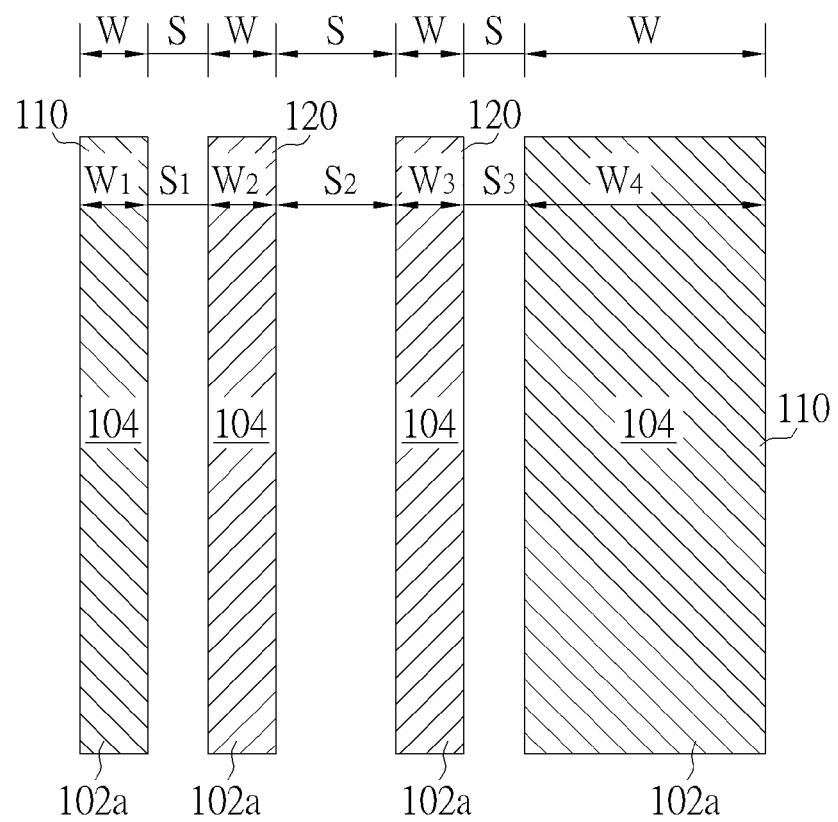

The layout pattern decomposition method 1 provided by the present invention further includes:

STEP 14a: Comparing the sums with a first predetermined value, when any one of the sums is smaller than the first predetermined value, the two 1D features on the two sides of the edge-to-edge space are colored by a first color and alternatively a second color STEP 14b: Comparing the width of the second space with a second predetermined value, when the width of the second space is smaller than the second predetermined value, the two 2D features on the two sides of the second space are colored by a first color and alternatively a second color Please refer to FIG. 5A. After obtaining the sum of the width of the edge-to-edge space S and the width W of the 1D feature 102a on the left side of the edge-to-edge space S, and obtaining the sum of the width of the edge-to-edge space S and the width W of the 1D feature 102a on the right side of the edge-to-edge space S, those sums are compared with a first predetermined value P: When any of the sums is smaller than the first predetermined value P, the two 1D features 102a on the two sides of the edge-to-edge space S are colored by a first color 110 and alternatively a second color 120. It is noteworthy that the first predetermined value P can be a minimum manufacturable width in accordance with the preferred embodiment, and the minimum manufacturable width is referred to the minimal width imageable on a mask. However, the first predetermined value P can be equal to or larger than the minimum manufacturable width. In the preferred embodiment, for example but not limited to, the first predetermined value P is 90 nanometer (hereinafter abbreviated as nm). In an exemplar as shown in FIG. 5A, the width $S_1$ of the edge-to-edge space S is 32 nm and the width $W_1/W_2$ of the two 1D features 102a on the two sides of the edge-to-edge space S are both 32 nm, consequently the sum of the width $S_1$ of the edge-to-edge space S and the width $W_1$ of the 1D feature 102a on the left side of the edge-to-edge space S is 64 nm, and the sum of the width $S_1$ of the edge-to-edge space S and the width $W_2$ of the 1D feature 102a on the right side of the edge-to-edge space S is also 64 nm. Since any abovementioned sum is smaller than the first predetermined value P, the two 1D features 102a on the two sides of the edge-to-edge space S are colored by the first color 110 and alternatively the second color 120. In another exemplar of the preferred embodiment, the first predetermined value P is 90 nm, the width $S_2$ of the edge-to-edge space S is 64 nm and the width $W_2/W_3$ of the 1D features 102a on the two sides of the edge-to-edge space S both are 32 nm. Consequently, the sum of the width $S_2$ of the edge-to-edge space S and the width $W_2$ of the 1D feature 102a on the left side of the edge-to-edge space S is 96 nm and the sum of the width $S_2$ of the edge-to-edge space S and the width $W_3$ of the 1D feature 102 on the right side of the edge-to-edge space S is also 96 nm. Since both sums are larger than the first predetermined value P, the 1D features 102a on the two sides of the edge-to-edge space S are colored by the same color, such as the second color 120 in the instant preferred embodiment. In still another exemplar of the preferred embodiment, the first predetermined value P is 90 nm, the width $S_3$ of the edge-to-edge space S is 32 nm, the width $W_3$ of the 1D feature 102a on the left side of the edge-to-edge space S is 32 nm, and the width $W_4$ of the 1D feature 102a on the right side of the edge-to-edge space S is 96 nm. Consequently, the sum of the width $S_3$ of the edge-to-edge space S and the width $W_3$ of the 1D feature 102a on the left side of the edge-to-edge space S is 64 nm, which is smaller than the first predetermined value P, and the sum of the width $S_3$ of the edge-to-edge space S and the width $W_4$ of the 1D feature 102 on the right side of the edge-to-edge space S is 128 nm, which is larger than the first predetermined value P. Since one of the sums is smaller than the first predetermined value P, the 1D features 102a on the two sides of the edge-to-edge space S are colored by the first color 110 and alternatively the second color 120.

Figure 5B:
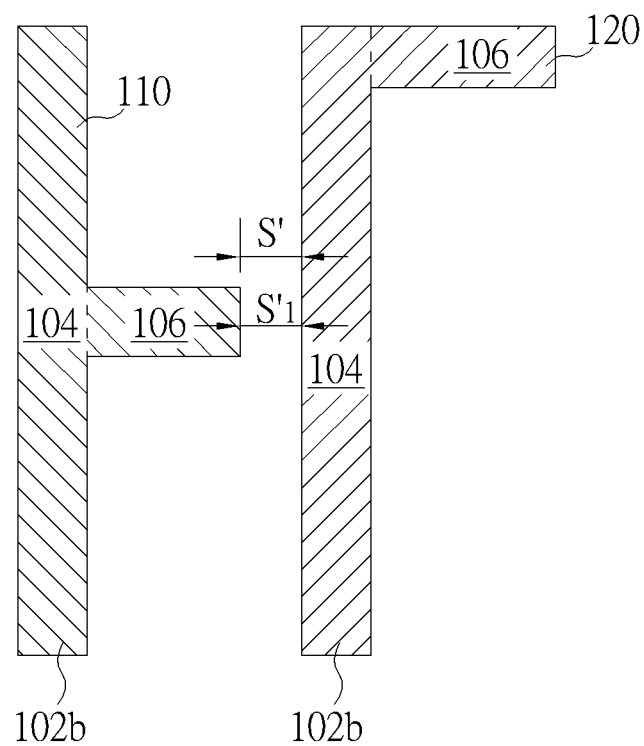

Please refer to FIG. 5B together with FIG. 5A. According to STEP 14b, which is performed simultaneously with STEP 14a, the width of the second space S' is compared with a second predetermined value P' after obtaining the second space S': When the width of the second space S' is smaller than the second predetermined value P', the 2D features 102b on the two sides of the second space S' are colored by the first color 110 and alternatively the second color 120. In the preferred embodiment, the second predetermined value P' can be any value decided by the operator. For example, in the case that the width $S'_1$ of the second space S' is smaller than the second predetermined value P', the 2D features 102b on the two sides of the second space S' are colored by the first color 110 and alternatively the second color 120, as shown in FIG. 5B.

The layout pattern decomposition method 1 provided by the present invention further includes:

STEP 16: Assigning the 1D features and the 2D features including the first color to a first pattern, and assigning the 1D features and the 2D features including the second color to a second pattern STEP 18: Outputting the first pattern to a first mask and outputting the second pattern to a second mask According to the layout pattern decomposition method 1 provided by the present invention, the 1D features 102a and the 2D features 102b including the first color 110 are assigned to a first pattern after coloring. In the same step, the 1D features 102a and the 2D features 102b including the second color 120 are assigned to the second pattern. It is noteworthy that the above mentioned STEPS 10-18 are implemented using a computer. Any computer or computer system suitable for use with embodiments of the present invention can be adopted. The computer system can include, for example but not limited to, a system bus, a data storage system as persistent storage for program and data files, a user interface input device including all possible types of device and ways to input information into the computer, a processor, a network interface serving as an interface to outside networks and is coupled to corresponding interface devices in other computer systems via a communication network, and a user interface output device including all possible types of device and ways to output information from the computer. Additionally, the computer itself can be of varying types including a personal computer, a portable computer, a workstation, a computer terminal, a network computer or user device.

After assigning the first pattern and the second pattern, the first pattern is outputted to a first mask and the second pattern is outputted to a second mask. The first mask and the second mask are used in the double patterning lithography.

According to the preferred embodiment, the first mask including the first pattern and the second mask including the second pattern are obtained by the abovementioned layout pattern decomposition method 1. Therefore features in the first pattern and the second pattern are all properly separated and thus can be precisely and successfully formed. Briefly speaking, the layout pattern decomposition method 1 provided by the preferred embodiment is performed to efficaciously decompose the original layout pattern and further improve the result of double patterning lithography.

Figure 6A:
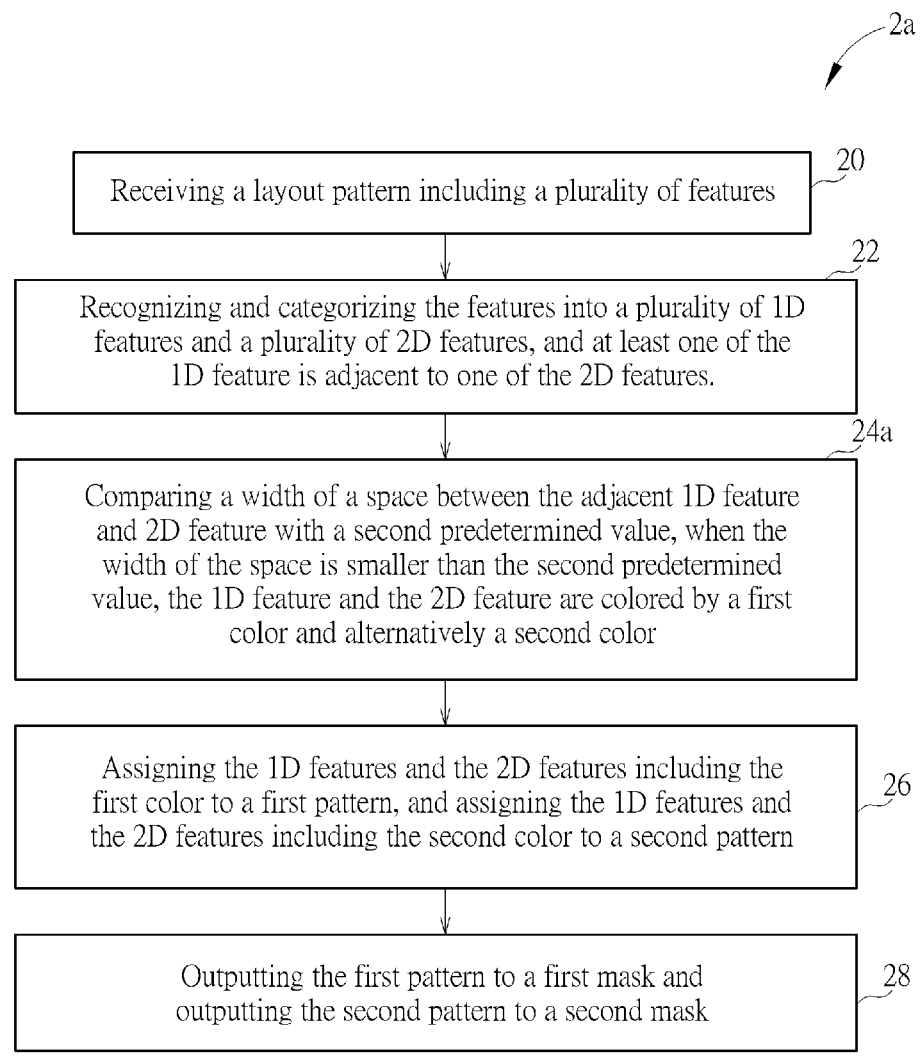
FIG. 6A is a flow chart of a layout pattern decomposition method provided by a second preferred embodiment of the present invention.
Figure 6B:
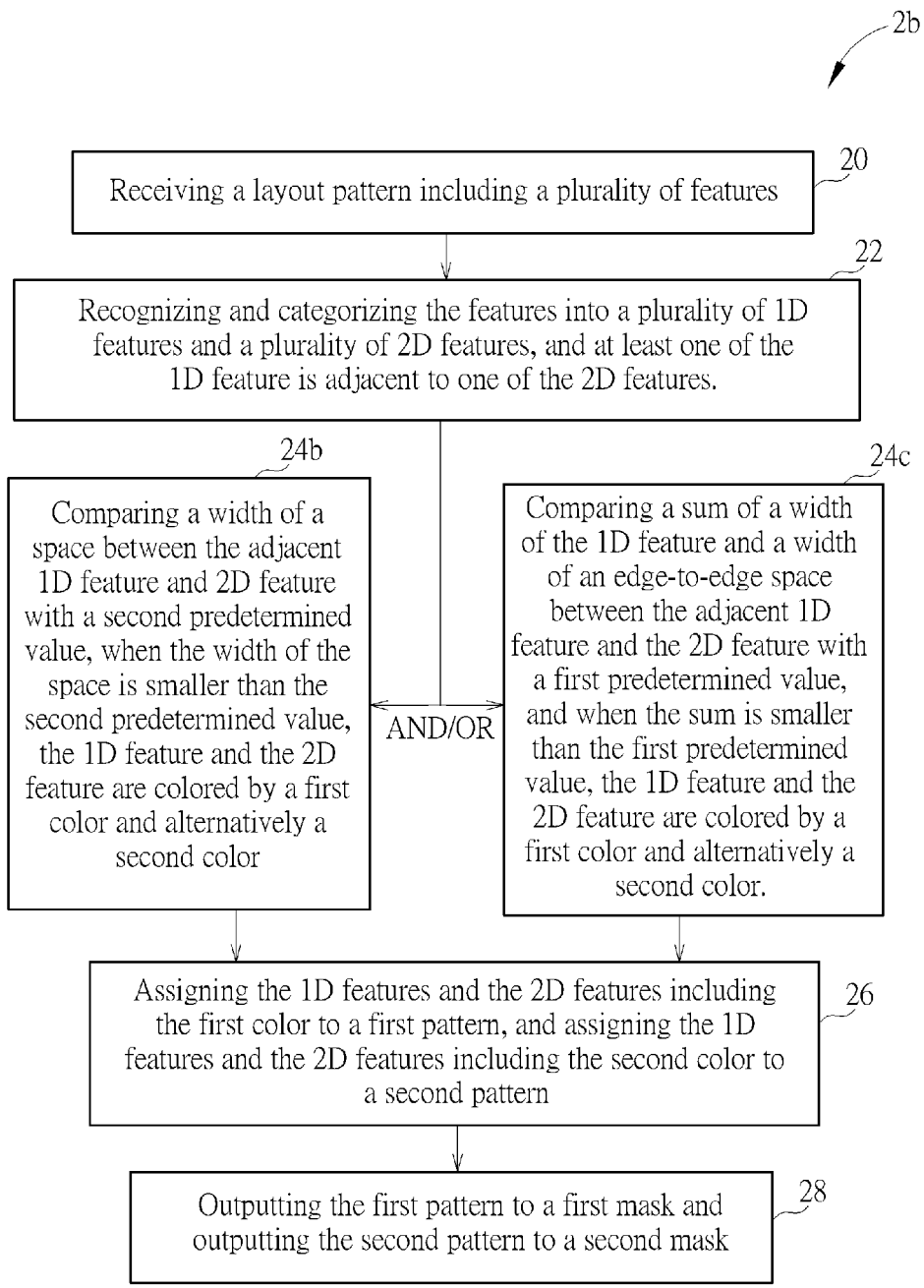
FIG. 6B is a flow chart of a layout pattern decomposition method provided by a third preferred embodiment of the present invention and a modification to the third preferred embodiment.
Figure 7:
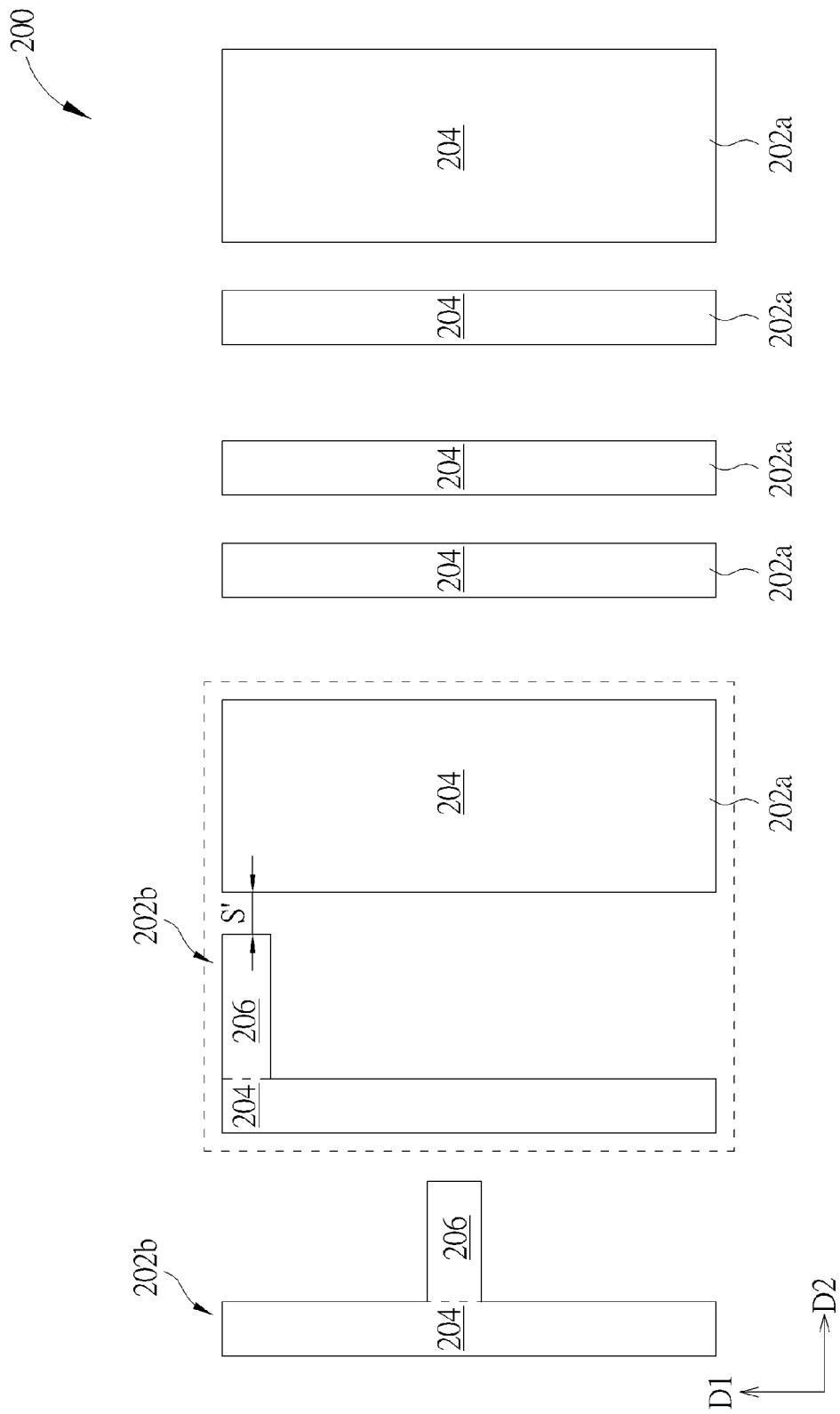
FIGS. 7-8 are schematic drawings illustrating the layout pattern decomposition method provided by the second preferred embodiment of the present invention.
Figure 8:
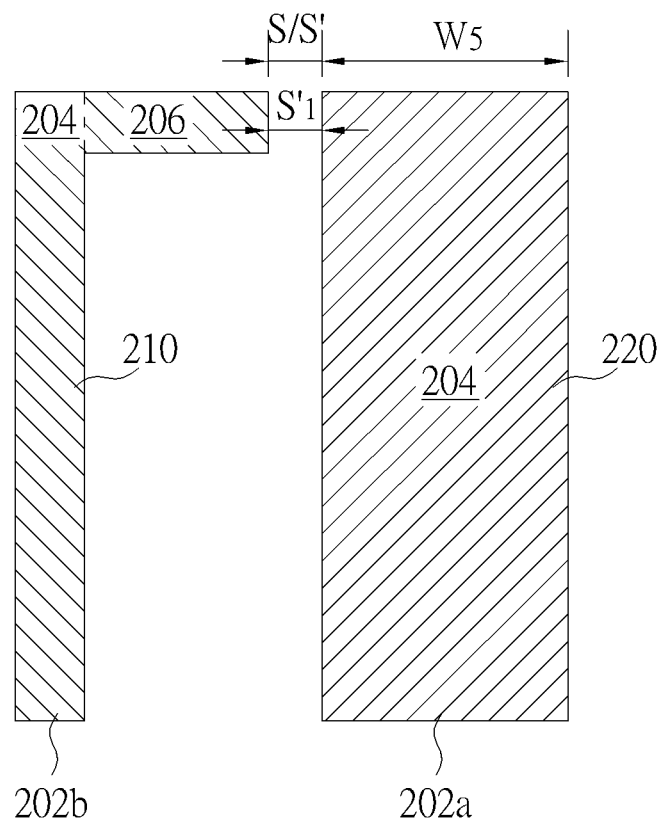

Please refer to FIGS. 6A and 7-8, FIG. 6 is a flow chart of a layout pattern decomposition method provided by a second preferred embodiment of the present invention, and FIGS. 7-8 are schematic drawings illustrating the layout pattern decomposition method provided by the second preferred embodiment. It is noteworthy that the layout pattern decomposition method 2a provided by the second preferred embodiment is implemented using a computer. And any computer or computer system suitable for use with embodiments of the present invention can be adopted. As shown in FIG. 6A, the layout pattern decomposition method 2a provided by the present invention includes:

STEP 20: Receiving a layout pattern including a plurality of features

Please refer to FIG. 7 together with FIG. 6A. As shown in FIG. 7, a layout pattern 200 is received. The layout pattern 200 includes.

The layout pattern decomposition method 2a provided by the present invention further includes a STEP 22:

STEP 22: Recognizing and categorizing the features into a plurality of 1D features and a plurality of 2D features, and at least one of the 1D feature is adjacent to one of the 2D features.

Please still refer to FIG. 7. Next, the features are recognized and categorized. In detail, when the features including only one first block 204 extending along a first direction D1 are recognized, such features are categorized to the 1D features 202a. And when the features including one first block 204 extending along the first direction D1 and at least a second block 206 extending along a second direction D2 are recognized, such features are categorized to the 2D features 202b. The first block 204 and the second block 206 of each 2D feature 202b physically contact each other, as shown in FIG. 7. Additionally, the first direction D1 and the second direction D2 are perpendicular to each other in accordance with the preferred embodiment. It should be noted that in any single layout pattern, the 1D features 202a are not always adjacent to the 1D features 202a. In the same concept, the 2D features 202b are not always adjacent to the 2D features 202b. Therefore the preferred embodiment and the following description detail the case that the 1D feature 202a is adjacent to the 2D feature 202b. As shown in the dotted frame emphasized in FIG. 7, at least one of the 1D features 202a is adjacent to one of the 2D features 202b in the layout pattern 200. The arrangement of the 1D features 202a adjacent to each other and the 2D features 202b adjacent to each other can be same with those detailed in the first preferred embodiment, and thus those details are omitted herein in the interest of brevity.

The layout pattern decomposition method 2a provided by the present invention further includes:

STEP 24a: Comparing a width of a space between the adjacent 1D feature and 2D feature with a second predetermined value, when the width of the space is smaller than the second predetermined value, the 1D feature and the 2D feature are colored by a first color and alternatively a second color Please still refer to FIG. 7. As mentioned above, after categorizing the features, measurement and calculation are performed specifically to the adjacent 1D feature 202a and 2D feature 202b. In the preferred embodiment, a width of a narrowest space between the adjacent 1D feature 202a and 2D feature 202b is defined as a second space S' and the second space S' is measured. Those skilled in the art would easily realize that since the 2D features 202b includes the first block 204 extending along the first direction D1 and the second block 206 extending along the second direction D2, there may be many spaces between the adjacent 1D feature 202a and 2D feature 202b. However, only the narrowest space S' between the adjacent 1D feature 202a and 2D feature 102b is picked as the second space S' and the second space S' is measured, as shown in FIG. 7.

Please refer to FIG. 8. After obtaining a width of the second space S', the width of the second space S' is compared with a second predetermined value P': When the width of the second space S' is smaller than the second predetermined value P', the 1D feature 202a and the 2D feature 202b on the two sides of the second space S' are colored by a first color 210 and alternatively a second color 220. It should be noted that in the preferred embodiment, the second predetermined value P' can be any value decided by the operator. For example, in the case that the width $S'_1$ of the second space S' is smaller than the second predetermined value P', the 1D feature 202a and the 2D feature 102b on the two sides of the second space S' are colored by the first color 210 and alternatively the second color 220, as shown in FIG. 8.

The layout pattern decomposition method 2a provided by the present invention further includes:

STEP 26: Assigning the 1D features and the 2D features including the first color to a first pattern, and assigning the 1D features and the 2D features including the second color to a second pattern STEP 28: Outputting the first pattern to a first mask and outputting the second pattern to a second mask According to the layout pattern decomposition method 2a provided by the present invention, the 1D features 202a and the 2D features 202b including the first color 210 are assigned to a first pattern after coloring. In the same step, the 1D features 202a and the 2D features 202b including the second color 220 are assigned to the second pattern after coloring. It is noteworthy that the above mentioned STEPS 20-26 are implemented using a computer.

After assigning the first pattern and the second pattern, the first pattern is outputted to a first mask and the second pattern is outputted to a second mask. The first mask and the second mask are used in the double patterning lithography.

Please refer to FIG. 6B, which is a flow chart of a layout pattern decomposition method provided by a third preferred embodiment of the present invention and its modification. It is noteworthy that the layout pattern decomposition method 2b provided by the preferred embodiment includes STEP 20 to STEP 22 and STEP 26 to STEP 28 the same with those described in the second preferred embodiment. Therefore those details are omitted for simplicity. The difference between the second and third preferred embodiments is: after performing STEP 22, STEP 24b and STEP 24c are performed:

STEP 24b: Comparing a width of a space between the adjacent 1D feature and 2D feature with a second predetermined value, when the width of the space is smaller than the second predetermined value, the 1D feature and the 2D feature are colored by a first color and alternatively a second color STEP 24c: Comparing a sum of a width of the 1D feature and a width of an edge-to-edge space between the adjacent 1D feature and the 2D feature with a first predetermined value, and when the sum is smaller than the first predetermined value, the 1D feature and the 2D feature are colored by a first color and alternatively a second color Please refer to FIG. 8. According to the preferred embodiment, STEP 24b is performed to compare a width of a space S' between the adjacent 1D feature 202a and 2D feature 202b with a second predetermined value P'. As mention above, since the 2D features 202b includes the first block 204 extending along the first direction D1 and the second block 206 extending along the second direction D2, there may be many spaces between the adjacent 1D feature 202a and 2D feature 202b. However, only the narrowest space S' between the adjacent 1D feature 202a and 2D feature 102b is picked as the second space S' and the second space S' is measured. Furthermore, STEP 24c is simultaneously performed to compare a sum of an edge-to-edge space S between the adjacent 1D feature 202a and 2D feature 202b and a width $W_5$ of the 1D feature 202a with a first predetermined value P.

In the preferred embodiment, when any of the comparison rules described in STEP 24b and STEP 24c is complied, the adjacent 1D feature 202a and 2D feature 202b are colored by different colors. In an exemplar provided by the preferred embodiment, comparison rule described in STEP 24b is adopted: When the space $S'_1$ between the 1D feature 202a and the 2D feature 202b is smaller than the second predetermined value P', the 1D feature 202a and the 2D feature 202b are colored by the first color 210 and alternatively the second color 220 as shown in FIG. 8. In another an exemplar that when the space S' between the adjacent 1D feature 202a and the 2D feature 202b is larger than the second predetermined value P', the comparison ruled provided by STEP 24c is adopted: When the sum of a width $W_5$ of the 1D feature 202a and a width of the edge-to-edge space S between the 1D feature 202a and the 2D feature 202b is smaller than the first predetermined value P, the 1D feature 202a and the 2D feature 202b are colored by the first color 210 and alternatively the second color 220. It should be noted that STEP 24b and STEP 24c are performed simultaneously, however the comparison rules can be adopted in any desirable sequential order.

Figure 9:
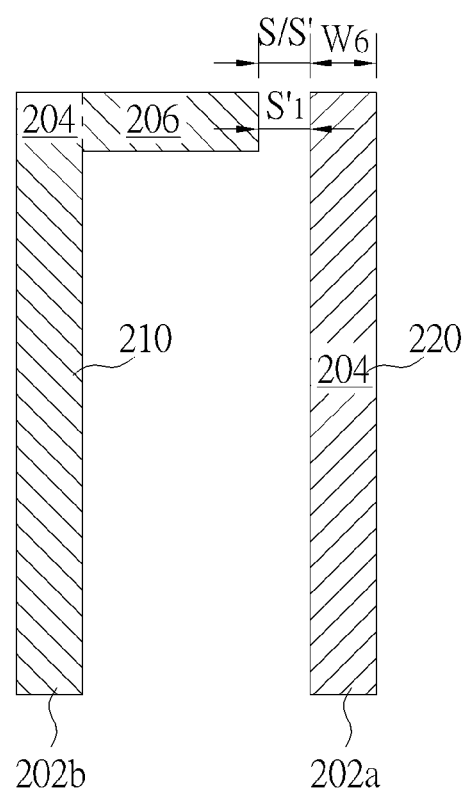
FIG. 9 is a schematic drawing illustrating the layout pattern decomposition method provided by the modification to the third preferred embodiment.

Furthermore, in a modification to the preferred embodiment, STEP 24b and STEP 24c are performed simultaneously, but only when both of the comparison rules are complied, the 1D feature 202a and the 2D feature 202b are colored by different colors. As shown in FIG. 9, for example but not limited to, (according to STEP 24b) when the space $S'_1$ between the adjacent the 1D feature 202a and 2D feature 202b is smaller than the second predetermined value P' and (according to STEP 24c) when the sum of the width $W_6$ of the 1D feature 202a and the width of the edge-to-edge space S (that is $S_1'$ in the modification) between the 1D feature 202a and the 2D feature 202b is smaller than the first predetermined value P, the 1D feature 202a and the 2D feature 202b are colored by the first color 210 and alternatively the second color 220. It should be noted that STEP 24b and STEP 24c are performed simultaneously, however the comparison rules can be adopted in any desirable sequential order.

According to the second and third preferred embodiments and its modification, the first mask including the first pattern and the second mask including the second pattern are obtained by the abovementioned layout pattern decomposition method 2a/2b. Therefore features in the first pattern and the second pattern are all properly separated and thus can be precisely and successfully formed. Briefly speaking, the layout pattern decomposition method 2a/2b provided by the preferred embodiments is performed to efficaciously decompose the original layout pattern and further improve the result of double patterning lithography.

According to the layout pattern decomposition methods provided by the present invention, different comparison rules are adopted depending on different types of features: By comparing the sum of the width of the edge-to-edge space between two adjacent features and at least one of the feature next to the edge-to-edge space with the first predetermined value, or by comparing the width of the space between two adjacent features with the second predetermined value, the features are colored by the first color and alternatively the second color systematically and efficaciously. And when different types of features are adjacent, the above mentioned two comparison rules can be both used or only one comparison rule can be adopted. The features including different colors are then assigned to the first pattern and alternatively the second pattern. More important, when the first pattern and the second pattern are respectively outputted to different masks, features formed on any single mask can be successfully and precisely formed in the double patterning lithography. Accordingly, the layout pattern decomposition methods provided by the present invention improve the result of the double patterning lithography.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern decomposition method, comprising steps of:
   (a) receiving a layout pattern comprising a plurality of features, and an edge-to-edge space being respectively defined between two adjacent features;
   (b) respectively calculating a sum of a width of the edge-to-edge space and a width of the feature on a left side of the edge-to-edge space, and a sum of the width of the edge-to-edge space and a width of the feature on a right side of the edge-to-edge space;
   (c) comparing the sums with a predetermined value, when any one of the sums is smaller than the predetermined value, the two features on the two sides of the edge-to-edge space are colored by a first color and alternatively a second color; and
   (d) assigning the features including the first color to a first pattern and assigning the features including the second color to a second pattern,
   wherein steps (a)-(d) are implemented using a computer.

2. The layout pattern decomposition method according to claim 1, wherein the predetermined value is equal to or larger than a minimum manufacturable width.

3. The layout pattern decomposition method according to claim 1, further comprising a step of outputting the first pattern to a first mask and outputting the second pattern to a second mask.

4. A layout pattern decomposition method, comprising steps of:
   (a) receiving a layout pattern comprising a plurality of features;
   (b) recognizing and categorizing the features into a plurality of one-dimension (1D) features and a plurality of two-dimension (2D) features, the 1D features respectively comprising only one first block extending along a first direction and the 2D features respectively comprising one first block extending along the first direction and at least a second block extending along a second direction;
   (c) comparing a sum of a width of a first space between two adjacent 1D features and a width of the 1D features next to the first space with a first predetermined value, when the sum is smaller than the first predetermined value, the two 1D features next to the first space are colored by a first color and alternatively a second color;
   (d) comparing a width of a second space between two adjacent 2D features with a second predetermined value, when the width of the second space is smaller than the second predetermined value, the two 2D features on the two sides of the second space are colored by the first color and alternatively the second color; and
   (e) assigning the 1D features and the 2D features including the first color to a first pattern, and assigning the 1D features and the 2D features including the second color to a second pattern,
   wherein steps (a)-(e) are implemented using a computer.

5. The layout pattern decomposition method according to claim 4, wherein the first direction and the second direction are perpendicular to each other.

6. The layout pattern decomposition method according to claim 4, wherein the first block and the second block of each 2D feature physically contact to each other.

7. The layout pattern decomposition method according to claim 4, wherein the first predetermined value is equal to or larger than a minimum manufacturable width.

8. The layout pattern decomposition method according to claim 4, further comprising a step of outputting the first pattern to a first mask and outputting the second pattern to a second mask.

9. A layout pattern decomposition method, comprising steps of:
   (a) receiving a layout pattern comprising a plurality of features;
   (b) recognizing and categorizing the features into a plurality of 1D features and a plurality of 2D features, the 1D features respectively comprising only one first block extending along a first direction and the 2D features respectively comprising a first block extending along the first direction and at least a second block extending along a second direction, and at least one of the 1D features being adjacent to one of the 2D features;

(c) comparing a width of a space between the adjacent 1D feature and 2D feature with a second predetermined value, when the width of the space is smaller than the second predetermined value, the 1D feature and the 2D feature are colored by a first color and alternatively a second color, and simultaneously comparing a sum of a width of an edge-to-edge space between the adjacent 1D feature and 2D feature and a width of the 1D feature with a first predetermined value when the width of the space between the adjacent 1D feature and 2D feature is smaller than the second predetermined value, and when the sum is smaller than the first predetermined value, the 1D feature and the 2D feature are colored by the first color and alternatively the second color; and (d) assigning the 1D features and the 2D features including the first color to a first pattern, and assigning the 1D features and the 2D features including the second color to a second pattern, wherein steps (a)-(d) are implemented using a computer.

10. The layout pattern decomposition method according to claim 9, wherein the first direction and the second direction are perpendicular to each other.

11. The layout pattern decomposition method according to claim 9, wherein the first block and the second block of each 2D feature physically contact to each other.

12. The layout pattern decomposition method according to claim 9, wherein the first predetermined value is equal to or larger than a minimum manufacturable width.

13. The layout pattern decomposition method according to claim 9, further comprising performing a step simultaneously with comparing the width of the space between the adjacent 1D feature and 2D feature with the second predetermined value, the step comprising: comparing the sum of the edge-to-edge space between the adjacent 1D feature and 2D feature and the width of the 1D feature with a first predetermined value when the width of the space between the adjacent 1D feature and 2D feature is larger than the second predetermined value; and when the sum is smaller than the first predetermined value, the 1D feature and the 2D feature are colored by the first color and alternatively the second color.

14. The layout pattern decomposition method according to claim 13, wherein the first predetermined value is equal to or larger than a minimum manufacturable width.

15. The layout pattern decomposition method according to claim 9, further comprising a step of outputting the first pattern to a first mask and outputting the second pattern to a second mask.

* * * * *